United States Patent [19]

Mee et al.

[11] Patent Number: 4,502,007
[45] Date of Patent: Feb. 26, 1985

[54] METHOD OF MEASURING NMR SPIN-SPIN RELAXATION TIME ($T_2$) USING SPIN-ECHOS

[76] Inventors: Gary L. Mee, 1958 Glosridge Dr.; M. Robert Willcott, 3502 Drummond, both of Houston, Tex.

[21] Appl. No.: 462,137

[22] Filed: Jan. 31, 1983

[51] Int. Cl.³ .............................................. G01R 33/08
[52] U.S. Cl. ...................................... 324/307; 324/300
[58] Field of Search ............... 324/300, 307, 311, 309, 324/312, 314

[56] References Cited

U.S. PATENT DOCUMENTS

| 4,068,161 | 1/1978 | Ernst  | 324/311 |
| 4,318,043 | 3/1982 | Crooks | 324/309 |

Primary Examiner—Michael J. Tokar
Attorney, Agent, or Firm—Vaden, Eickenroht, Thompson, Bednar & Jamison

[57] ABSTRACT

A method is disclosed for measuring the NMR spin-spin relaxation time ($T_2$) of nuclei using spin-echos comprising the steps of locating the nuclei in a static magnetic field, applying an RF pulse to the nuclei at the Larmor frequency of the nuclei of sufficient duration to rotate the net magnetic moment of the nuclei 90°, waiting a time period tau that is at least the time required for the free induction decay signal to go to zero, applying an RF pulse at the same Larmor frequency to the nuclei of sufficient duration to rotate the net magnetic moment of the nuclei 180°, recording the primary echo induced, waiting a time period equal to at least 3 tau, to cause the stimulated echos produced by the inhomogeneities in the RF magnetic field to fall into separate time zones from each other and the primary echo, applying an RF pulse at the same Larmor frequency to the nuclei of sufficient duration to rotate the net magnetic moment of the nuclei another 180° to produce the primary and error stimulated echos, recording the primary and error stimulated echos induced thereby during a time period sufficient to allow the peaks of all of the error stimulated echos and the primary echos to appear in different time slots in the time zone, repeating the last three steps to obtain a series of frames each of which contain a primary echo and error stimulated echos, adding the primary echo and related error stimulated echos in each frame to obtain points on a decay curve indicating T2 relaxation time.

5 Claims, 1 Drawing Figure

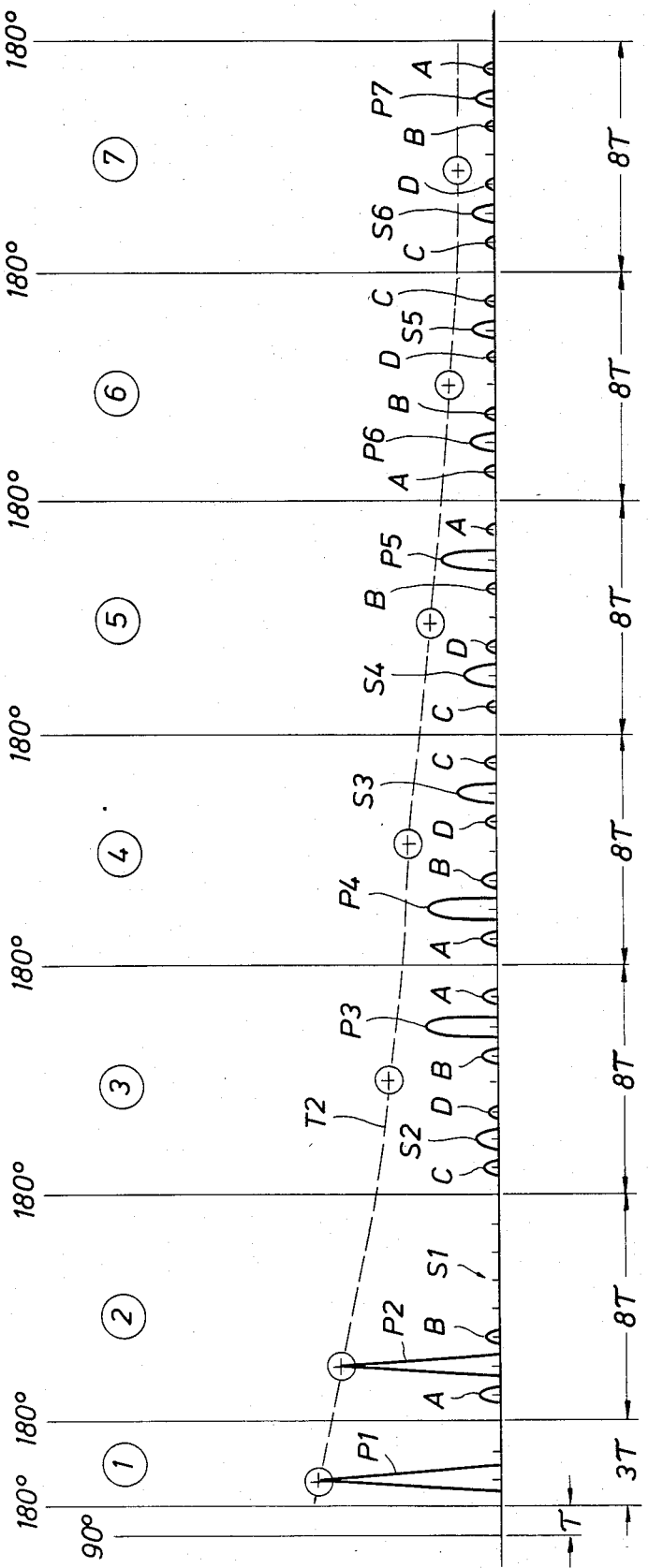

METHOD OF MEASURING NMR SPIN-SPIN RELAXATION TIME ($T_2$) USING SPIN-ECHOS

This invention relates to methods of measuring nuclear magnetic resonance characteristics of nuclei generally, and, in particular to a method of measuring the spin-spin relaxation time ($T_2$) of nuclei using spin echoes.

The spin echo technique was developed to measure spin-spin relaxation time ($T_2$) because of the errors caused by inhomogeneities in the static and RF magnetic fields of NMR machines. It includes the steps of applying an RF pulse sequence at the Larmor frequency of the nuclei, whose $T_2$ is being measured. The first RF pulse is sufficient duration to force the net magnetic moment of the nuclei to rotate 90°. This is followed by a series of RF pulses at the same Larmor frequency of sufficient duration to rotate the net magnetic filed 180°. After each 180° pulse a spin-echo signal is produced. The $T_2$ relaxation time of the nuclei is indicated by the curve drawn through the points of maximum amplitude of the echo signals received.

This technique would produce an accurate measurement of $T_2$ if the RF magnetic field was uniform at the same Larmor frequency because then only one spin-echo signal would be generated with each 180° pulse. Unfortunately, the RF magnetic field is not uniform. For example, some portions of the RF field may be at the Larmor frequency but other portions may be at a higher or lower frequency. As a result, as suggested by Hahn in his paper entitled "Spin Echos" (*Physical Review* Vo. 80, No. 4, Nov. 15, 1948) the inhomogeneities in the RF magnetic field produce what he called "stimulated echos" in addition to the primary echos.

In the present practice of the spin-echo technique for measuring $T_2$, after the 90° pulse, the first 180° pulse occurs after a time period, usually called "tau", that is at least as great as the time required for the free induction decay of the echo signal produced by the RF pulses. The second and all subsequent 180° pulses occur at 2 tau intervals. This timing sequence is written 90—tau—180—2 tau—180 where the time intervals are between pulses. Starting from time, t equals zero, it would be 90—tau—180—3 tau—180—5 tau . . . . This sequence causes the primary echo signals to appear at 2 tau, 4 tau, 6 tau . . . . Stimulated echos, however, can appear at these same times and when they do, they will be masked by and mingled with the primary echos. As a result, the degree of error in the measured $T_2$ is unknown.

It is an object of this invention to provide time intervals between pulses based on multiples of a time unit, tau, that will cause the peaks of the stimulated echos to appear in different time slots from the time slots in which the peak of the primary echos appear to allow related error signals to be added to the primary echos to obtain a substantially accurate $T_2$ decay curve.

It is a further object of this invention to provide a method of measuring NMR spin-spin relaxation time ($T_2$) of nuclei using spin echos.

In accordance with this invention, it has been determined that an initial three pulse sequence of 90—tau—180—3 tau—180 —will cause the primary and secondary stimulated echo signals to appear in time slots 4 tau apart. Therefore, subsequent 180° pulses should be spaced far enough apart to provide time frames wide enough to receive both types of signals, which is a minimum of seven tau. Preferably tau is the width of the echo signals received for twice the free induction decay time.

Referring now to the drawing, a typical measurement of $T_2$ will be described.

In the drawing, seven 180° pulse time frames are shown following a 90° pulse. The first 180° pulse occurred at time tau after the 90° pulse. This was followed after a delay of three tau, by subsequent 180° pulses each of which occur after a time interval of eight tau. As stated above, a time frame equal to seven tau' could be used but it is preferred to provide a time frame that is more than adequate in width to accommodate all echos that may be received. Tau in the drawings is indicated by the Greek letter r.

We start with a 90° pulse, which may or may not be exactly 90°, but by using the method of this invention that is not critical and eliminates the time, which was often substantial, that was heretofore spent in tuning the NMR machine in order to get as close to exactly 90° and 180° as possible with the equipment. In other words, in the prior art pulse sequence, much time had to be spent in attempting to eliminate all possible error before measuring $T_2$. With the method of this invention, whatever error appears can be accounted for and it is not necessary to spend the time calibrating the equipment that was heretofore required.

It is important, however, in the practice of this invention, that the timing of the pulse sequence be accurate and also the phase relationship of the RF signals be maintained.

First, the nuclei are subjected to a 90° pulse followed after time tau by an 180° pulse. No echos result from the initial 90° pulse, but there is a free induction decay so it is necessary to wait a time period at least long enough to allow the free induction decay to occur. In the middle of time frame 1, a single echo P1 will be generated as a result of the first 180° pulse and will peak at time interval tau into time interval 1. This is followed by the second 180° pulse that follows the first one by a time interval of 3 tau.

Following this second 180° pulse, echo P2 appears two tau after the pulse. This is another primary pulse and one will occur in each time frame although they will reverse their position in the time frame with each 180° pulse. They are indicated as P1-P7 in the drawing.

If the 90° and 180° pulses were exactly uniform, these are the only echos we would get, however, since they are not, and the RF magnetic fields are not uniform, error stimulated echos will appear.

Echos A and B appear on each side of echo P2 in Frame 2 at time intervals of tau and 3 tau. Echo A results primarily because of errors in the 90° pulse. Echo B is caused by what error there was in the 90°–180° pulse combination that preceded the second 180° pulse. Neither of these echos represent the initial spin shown in P1 and therefore can be ignored.

The stimulated or secondary echos that are the errors that are subtracted from the primary echos due to the inhomogeneity of the Rf magnetic field of the NMR machine are the ones that are of primary interest. They are designated S1-S6 in the drawing and will be referred to as secondary stimulated echos. They form an echo train of increasing amplitude. This secondary pulse train is basically the error signal created from the primary pulse train and as soon as the error signal appears which is usually in time frame 3, it will continue to propagate along with the primary echo. So the primary echo decays faster than the actual or true exponential decay while the secondary echo train increases asymptotically to the primary train because any error terms causing a transfer from primary to secondary will work in reverse taking secondary echos back into the primary slot. So by adding the primary and secondary signals, a true indication of how much phase coherent energy in each time frame remains of the original phase coherent energy that was in P.1 originally. Consequently, beginning with time frame 3, by adding primary and secondary signals points on the curve that indicates accurately the $T_2$ relaxation time will be obtained. The curve in the drawing is indicated as $T_2$.

Additional error signals C and D appear in each time slot 2 on either side of the secondary stimulated echos. These, like echos A and B discussed above, are due to 90° errors and the 90° to 180° error. They are not added in the data reduction to obtain curve $T_2$ since they do not in any way effect the amplitude of the primary or secondary echos.

From the foregoing it will be seen that this invention is one well adapted to attain all of the ends and objects hereinabove set forth, together with other advantages which are obvious and which are inherent to the apparatus and structure.

It will be understood that certain features and subcombinations are of utility and may be employed without reference to other features and subcombinations. This is contemplated by and is within the scope of the claims.

Because many possible embodiments may be made of the invention without departing from the scope thereof, it is to be understood that all matter herein set forth or shown in the accompanying drawings is to be interpreted as illustrative and not in a limiting sense.

What is claimed is:

1. A method of measuring the NMR spin-spin relaxation time ($T_2$) of nuclei using spin-echos comprising the steps of locating the nuclei in a static magnetic field, applying an RF pulse to the nuclei at the Larmor frequency of the nuclei of sufficient duration to rotate the net magnetic moment of the nuclei 90°, waiting a time period tau that is at least the time required for the free induction decay signal to go to zero, applying an RF pulse at the same Larmor frequency to the nuclei of sufficient duration to rotate the net magnetic moment of the nuclei 180°, recording the primary echo induced, waiting a time period equal to at least 3 tau to cause the stimulated echos produced by the inhomogeneities in the RF magnetic field to fall into separate time zones from each other and the primary echo, applying an RF pulse at the same Larmor frequency to the nuclei of sufficient duration to rotate the net magnetic moment of the nuclei another 180° to produce the primary and stimulated echos, recording the primary and error stimulated echos induced thereby during a time period sufficient to allow the peaks of all of the stimulated echos and the primary echo to appear in different time slots in the time zone, repeating the last three steps to obtain a series of frames each of which contain a primary echo and stimulated echos, adding the primary echo and related stimulated echos in each frame to obtain points on a decay curve indicating T2 relaxation time.

2. The method of claim 1 in which tau equals twice the time required for the free induction decay to go to zero.

3. The method of claim 2 in which the time period sufficient to record the echos in different time slots is at least 7 tau.

4. A method of measuring the spin-spin relaxation time ($T_2$) of nuclei using nuclear magnetic resonance comprising the steps of locating the nuclei in a static magnetic field, applying an RF pulse to the nuclei at the Larmor frequency of the nuclei and of sufficient duration to rotate the nuclei 90°, waiting a time period tau that is at least the twice the time required for the free induction decay signal to go to zero, applying an RF pulse at the same Larmor frequency to the nuclei of sufficient duration to rotate the net magnetic moment of the nuclei 180°, recording the primary and secondary stimulated echos induced, waiting a time period equal to at least 3 tau, applying an RF pulse at the same Larmor frequency to the nuclei of sufficient duration to rotate the nuclei another 180°, recording the primary and secondary stimulated echos induced thereby, waiting a time period equal to at least 7 tau, applying an RF pulse at the same Larmor frequency to rotate the nuclei another 180°, recording the primary and secondary stimulated echos induced thereby, repeating the last three steps to obtain a series of frames each of which contain a primary echo and a secondary stimulated echo, adding the secondary stimulated echo in each frame where they both appear to the primary echo to obtain points on a decay curve to allow the peaks of all of the error stimulated echos on a decay indicating $T_2$ relaxation time.

5. The method of claim 4 in which the time period of at least 7 tau is 8 tau.

* * * * *